United States Patent
Mizuno et al.

[11] Patent Number: 6,016,433
[45] Date of Patent: Jan. 18, 2000

[54] OXIDE SUPERCONDUCTOR JOSEPHSON JUNCTION ELEMENT AND PROCESS FOR PRODUCING SAME

[75] Inventors: Yuuji Mizuno, Kashiwa; Yoshihiro Ishimaru, Yokohama; Youichi Enomoto, Tokyo, all of Japan

[73] Assignees: International Superconductivity Technology Center; Sharp Kabushiki Kaisha, both of Japan

[21] Appl. No.: 08/921,551

[22] Filed: Sep. 2, 1997

[30] Foreign Application Priority Data

Sep. 2, 1996 [JP] Japan ................................. 8-232347

[51] Int. Cl.[7] ........................... H01B 12/00; H01L 29/06
[52] U.S. Cl. ............................. 505/190; 257/34; 257/31; 257/627
[58] Field of Search ................................ 257/34, 31, 627; 505/190, 191, 193

[56] References Cited

U.S. PATENT DOCUMENTS

| 5,304,817 | 4/1994 | Ishida .......................................... 257/31 |
| 5,422,337 | 6/1995 | Tanaka et al. .......................... 505/190 |
| 5,472,934 | 12/1995 | Akoh et al. .............................. 505/190 |
| 5,525,582 | 6/1996 | Tanaka et al. .......................... 505/190 |
| 5,534,715 | 7/1996 | Neumann et al. ........................ 257/33 |
| 5,571,778 | 11/1996 | Fujimoto et al. ....................... 505/329 |
| 5,599,465 | 2/1997 | Park et al. .................................. 216/3 |
| 5,612,290 | 3/1997 | Tanaka et al. .......................... 505/190 |
| 5,624,885 | 4/1997 | Tanaka et al. .......................... 505/234 |
| 5,650,376 | 7/1997 | Badaye et al. .......................... 505/238 |
| 5,656,575 | 8/1997 | Mueller .................................... 505/190 |
| 5,719,105 | 2/1998 | Odagawa et al. ....................... 505/234 |
| 5,877,122 | 3/1999 | Ishimaru et al. ........................ 505/190 |

FOREIGN PATENT DOCUMENTS

1-241874  9/1989  Japan .

OTHER PUBLICATIONS

Wollman et al., Evidence for dx2–y2 Pairing from the Magnetic Field Modulation of YBa2Cu3O7–Pb Josephson Junctions, Phsical Review Letters, vol. 74, No. 5, Jan. 30, 1995.

Primary Examiner—Jerome Jackson, Jr.
Assistant Examiner—Bradley Wm. Baumeister
Attorney, Agent, or Firm—Lorusso & Loud

[57] ABSTRACT

Any oxide superconductor Josephson junction element having an oxide superconductor oriented in the c-axis direction with respect to a substrate, and a needle-like, a-axis (or b-axis) oriented oxide superconductor. Both sides of the needle-like, a-axis (or b-axis) oriented oxide superconductor are sandwiched between the c-axis oriented superconductors. The crystal boundary sections between the needle-like, a-axis (or b-axis) oriented oxide superconductor and each of the c-axis oriented superconductors form a weak link of the Josephson junction. The needle-like, a-axis (or b-axis) oriented oxide superconductor is grown such that the c-axis direction thereof is oriented in the (110) direction which is inclined at an angle of 45 degrees with respect to the (100) direction or (010) direction of the c-axis oriented superconductors.

8 Claims, 5 Drawing Sheets

OXIDE SUPERCONDUCTOR JOSEPHSON JUNCTION ELEMENT AND PROCESS FOR PRODUCING SAME

BACKGROUND OF THE INVENTION

This invention relates to an oxide superconductor Josephson junction element having a Josephson junction using an oxide superconductor and a process of producing same. Specifically, the present invention pertains to a Josephson junction using only an oxide superconductor having a junction of (110) plane and (001) plane of an oxide superconductor which is a d-wave superconductor.

In Josephson junctions which represent a basic oxide superconductor electric device, it is reported in, for example, an article of Y. Ishimaru et al., Jpn. J. Appl. Phys. 34 (1995) L1123 and Solid Static Physics, June (1966) p541–548, that a Josephson junction using an oxide superconductor having a (110)-(001) junction of a d-wave superconductor using only an oxide superconductor, for example, a junction in which a needle-like a-axis (or b-axis) oriented oxide superconductor film is sandwiched between c-axis oriented oxide super conductor films to use, as a weak link, the needle-like a-axis (or b-axis) oriented portion or the crystal boundary between the c-axis oriented portion and the a-axis (or b-axis) oriented portion, exhibits excellent characteristics such as relatively high IcRn (critical current x normal conductive resistance (Rn)) and current voltage characteristics of a clear weak link which may be explained by the RSJ model.

In a junction using a needle-like, a-axis (or b-axis) oriented, oxide superconductor film region which has been grown such that the direction of the c-axis thereof is inclined at an angle of 45 degrees with respect to the (100) or (010) direction of a substrate and a c-axis oriented oxide superconductor film, phenomena specific to copper-type oxide superconductors, such as a phenomenon that the Ic is minimum in a zero magnetic field, are reported, as described in the above article of Y. Ishimaru et al., Jpn. J. Appl. Phys. 34 (1995) L1532.

In the above prior art, the fabrication of the junction is limited to a method in which needle-like a-axis (or b-axis) oriented portions, which are formed in happenstance in a c-axis oriented film, are utilized. The formation of such needle-like a-axis (or b-axis) oriented portions is considered to be attributed to, for example, the influence of the temperature of the substrate or the atmosphere in which the oxide superconductor film has been formed and the roughness of the surface of the substrate. It is, therefore, difficult to control the formation of such portions. It is completely impossible to form such portions at desired positions of the substrate with good reproducibility. Thus, the above technique is not suited for purposes other than the study of the Josephson junctions per se. There is, accordingly, a problem that the practical applications to, for example, superconducting quantum interference devices (SQUID) are not possible.

SUMMARY OF THE INVENTION

It is an object of the present invention to provide an oxide superconductor Josephson junction element which permits practical circuit applications and which includes an a-axis (or b-axis) oriented oxide superconductor region at predetermined position on a substrate and a c-axis oriented oxide superconductor region.

Another object of the present invention is to provide a technique which permits, with good reproducibility, the fabrication of an oxide superconductor Josephson junction element including an a-axis (or b-axis) oriented oxide superconductor region at predetermined position on a substrate and a c-axis oriented oxide superconductor region.

In accomplishing the foregoing objects, there is provided in accordance with the present invention an oxide superconductor Josephson junction element comprising a substrate, first and second oxide superconductor portions provided on said substrate and oriented in the c-axis direction with respect to said substrate, and a third oxide superconductor portion of a needle-like form oriented in the a-axis (or b-axis), wherein said element has a structure in which said third portion is sandwiched between said first and second portions, wherein the crystal boundary sections between said third portion and each of said first and second portions form a weak link of the Josephson junction, and wherein said third portion is grown such that the c-axis direction thereof is oriented in the (110) direction which is inclined at an angle of 45 degrees with respect to the (100) direction or (010) direction of said first and second portions.

In the above oxide superconductor Josephson junction element, the needle-like, a-axis (or b-axis) oriented oxide superconductor (third portion) is preferably provided only in a surface flatness deteriorated region or a composition deteriorated region formed on a predetermined position of the substrate.

In the above oxide superconductor Josephson junction element, the Josephson junction characteristics are preferably such that the critical current (Jc) is zero when an external magnetic field is zero and has a finite critical current value of not zero when a finite external magnetic field exists.

In the above oxide superconductor Josephson junction element, $LnBa_2Cu_3O_{7-x}$ (Ln: a rare earth element including Y, $0 \leq x \leq 0.5$) deposited by a method selected from a sputtering method, a pulse laser method, a chemical vapor phase deposition (CVD) method and concurrent vapor deposition method is used as the oxide superconductor.

In the above oxide superconductor Josephson junction element, $NdBa_2Cu_3O_{7-x}$ ($0 \leq x \leq 0.5$) deposited by a method selected from a RF sputtering method and a pulse laser method is used as the oxide superconductor.

In the above oxide superconductor Josephson junction element, $YBa_2Cu_3O_{7-x}$ ($0 \leq x \leq 0.5$) deposited by a pulse laser method is used as the oxide superconductor.

The present invention also provides a process for producing the above oxide superconductor Josephson junction element, wherein a surface flatness deteriorated region or a composition deteriorated region is previously formed on a predetermined position of the substrate and wherein an oxide superconductor is then grown to form an a-axis or b-axis oriented oxide superconductor region only on the surface flatness deteriorated region or composition deteriorated region with the other region being provided with a c-axis oriented oxide superconductor.

In the above production method, the surface flatness deteriorated region or composition deteriorated region is formed by irradiating the substrate with a focused $Ga^+$ ion beam from above.

According to the above means, there is obtained an oxide superconductor Josephson junction element capable of being applied to practical circuits and composed of a needle-like, a-axis (or a b-axis) oriented oxide superconductor (third portion) provided at a predetermined position of a substrate and c-axis oriented oxide superconductors (first and second portions).

Since the oxide superconductor Josephson junction element according to the present invention exhibits such Josephson junction characteristics that the critical current (Ic) is 0 when the external magnetic field is 0 and has a finite critical current value of not zero when a finite external magnetic field having a finite value of not zero exists, an electric device including, for example, a NAND circuit can be easily realized.

Further, an oxide superconductor Josephson junction element composed of a-axis (or a b-axis) oriented oxide superconductor provided at a predetermined position of a substrate and c-axis oriented oxide superconductors can be prepared with good reproducibility.

BRIEF DESCRIPTION OF THE DRAWINGS

Other objects, features and advantages of the present invention will become apparent from the detailed description of the preferred embodiments of the invention and accompanying drawings, in which.

DETAILED DESCRIPTION OF THE PREFERRED EMBODIMENTS OF THE INVENTION

Figure 1:
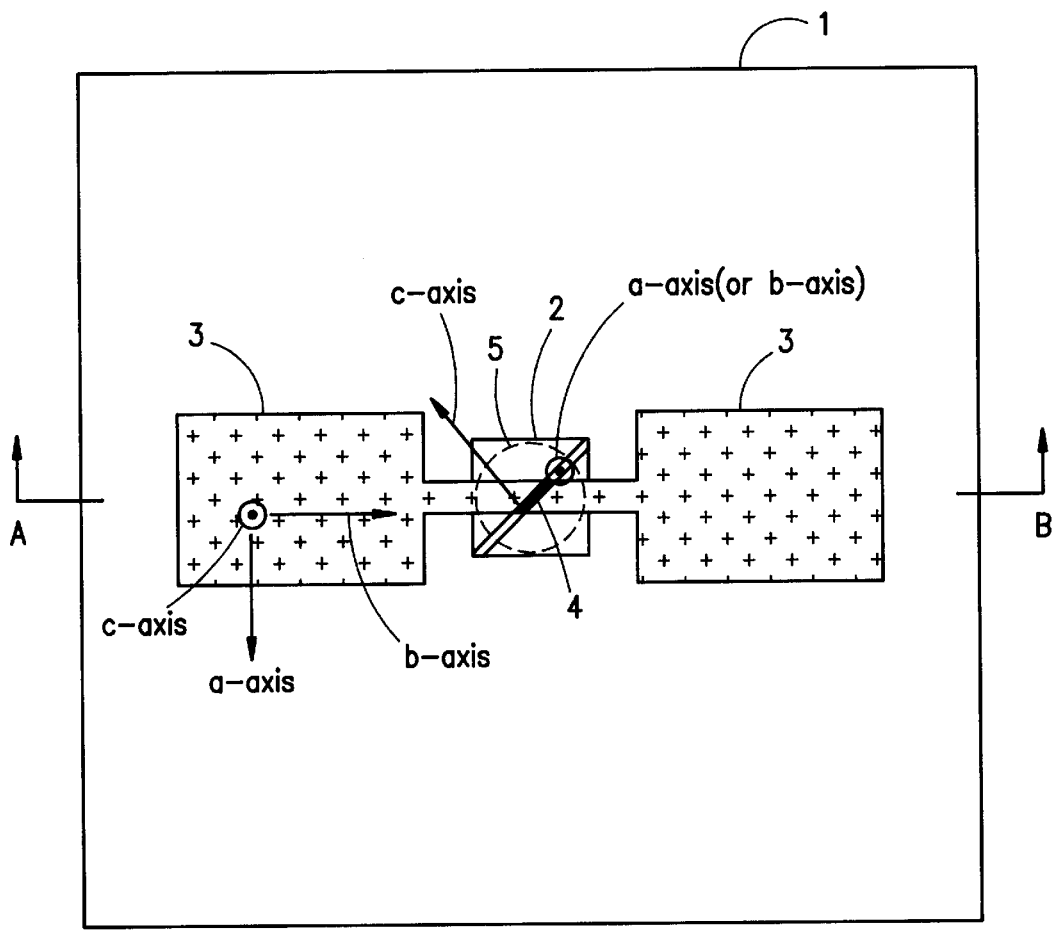
FIG. 1 is a schematic plan view diagrammatically showing the constitution of one embodiment of an oxide superconductor Josephson junction element according to the present invention.
Figure 2:
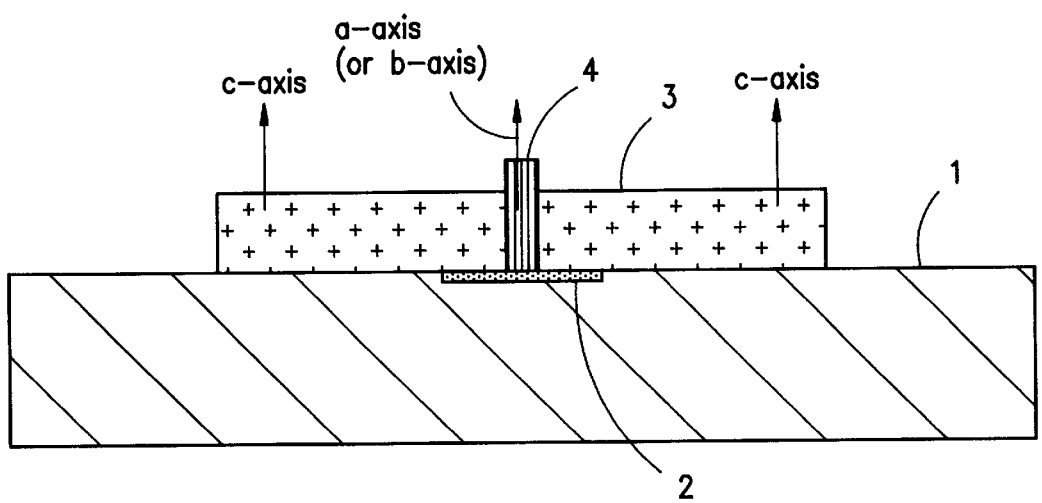
FIG. 2 is a sectional view taken along the line A–B in FIG. 1.

FIG. 1 is a schematic plan view diagrammatically showing the constitution of one embodiment (example) of an oxide superconductor Josephson junction element according to the present invention and FIG. 2 is a sectional view taken along the line A–B in FIG. 1. Designate as 1 is a substrate, 2 a focused ion beam-irradiated region using a focused ion beam device (FIB), 3 a c-axis oriented oxide superconductor film, 4 a needle-like, a-axis (or b-axis) oriented oxide superconductor film and 5 a weakly linked section of a Josephson junction. The crystal grain boundary of a region of the needle-like, a-axis or b-axis oriented oxide superconductor film 4 and a region of the c-axis oriented oxide superconductor film 3 represents a Josephson junction.

The oxide superconductor Josephson junction element of this embodiment (oxide superconductor Josephson junction element) includes, as shown in FIGS. 1 and 2, a region of the oxide superconductor film 3 oriented in the c-axis relative to the substrate 1 and a region of the oxide superconductor film 4 oriented like a needle and in the direction of the a-axis or b-axis and has a structure such that both sides of the region of the needle-like, a-axis or b-axis oriented film 4 is sandwiched between the regions of the c-axis oriented oxide superconductor film 3 portions. The crystal boundary sections between the region of the needle-like, a-axis (or b-axis) oriented oxide superconductor and the c-axis oriented oxide superconductor form a weak link 5 of the Josephson junction. The c-axis direction of the region of the needle-like, a-axis (or b-axis) oriented film 4 is oriented in the (110) direction which is inclined at an angle of 45 degrees with respect to the (100) direction or (010) direction of the substrate 1 and the c-axis oriented oxide superconductor film 3.

Further, the region of the needle-like, a-axis or b-axis oriented film 4 is provided only on a surface flatness deteriorated region or a composition deteriorated region (the region 2 irradiated with an ion beam by FIB) formed on a predetermined position of the substrate 1.

FIGS. 3(a)–3(e) are illustrations explanatory of a method of producing an oxide superconductor Josephson junction element according to the present invention and are sectional or plan views in each of the steps.

Figure 3A:
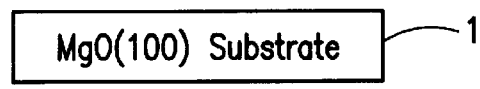
FIGS. 3(a)–3(d) are schematic plan views in each of the steps for producing the embodiment of an oxide superconductor Josephson junction element according to the present invention.
Figure 3B:
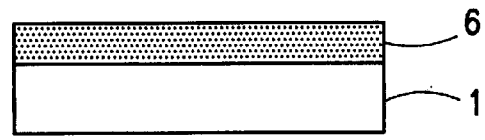
Figure 3C:
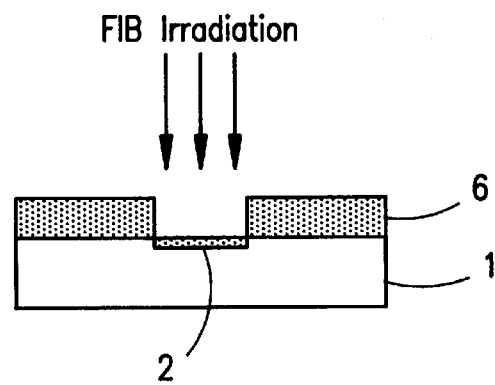

In the method of producing an oxide superconductor Josephson junction element of an embodiment 1 according to the present invention, a (100) MgO single crystal substrate of 10 mm×10 mm is used as a substrate 1 as shown in FIG. 3(a). A gold film 6 having a thickness of about 120 nm is deposited on a whole surface of the substrate 1 by a direct current (DC) sputtering method. Then, as shown in FIG. 3(c), the resulting substrate 1 is placed in a focused ion beam device (FIB) and a predetermined portion thereof is irradiated with a $Ga^+$ ion beam accelerated at 30 KeV. The irradiation is performed on a rectangular parallelepiped region (30 $\mu$m×30 $\mu$m) of a side of the substrate 1 on which an oxide superconductor film has been deposited. The beam current is about 2 nA, the beam diameter is about 0.1 $\mu$m and the dose of $Ga^+$ ion is about $5 \times 10^{17}$.

After the removal of the entire gold film 6, a $NdBa_2Cu_3O_{7-x}$ ($0 \leq x \leq 0.5$) film as a c-axis oriented oxide superconductor film 3 is formed on the substrate 1 by a RF sputtering method or a pulse laser method. The film forming conditions are such that a completely c-axis oriented $NdBa_2Cu_3O_{7-x}$ superconductor film is generally obtained, i.e. a target of $NdBa_2Cu_3O_{7-x}$ polycrystal, a temperature of the substrate 1 of 750° C., a discharge pressure of 80 mTorr, an $O_2$ gas flow rate of 1 sccm, an Ar gas flow rate of 5 sccm, an input rf output of 60 W and growth time of 60 minutes. The thickness of the film is 300 nm.

As a result, needle-like crystal grains were formed only at the $Ga^+$ irradiated region (the region 2 irradiated with the focused ion beam) of the $NdBa_2Cu_3O_{7-x}$ superconductor film. An observation with AFM (interatomic force microscope) revealed that the needle-like region is protruded from the other region and has an a-axis orientation having a high growing speed. The other region was found to be completely oriented in the c-axis direction. When the $NdBa_2Cu_3O_{7-x}$ superconductor film was measured for its X-ray diffraction pattern, only peaks of c-axis oriented $NdBa_2Cu_3O_{7-x}$ and peaks of the substrate (MgO substrate) were observed but no peaks of a-axis oriented $NdBa_2Cu_3O_{7-x}$ were observed. The reason why such an X-ray diffraction pattern was obtained is considered to be that the region occupied by the a-axis (or b-axis) oriented portion is very small.

Figure 3D:
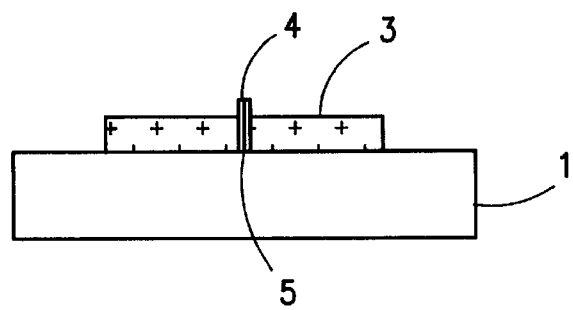
Figure 3E:
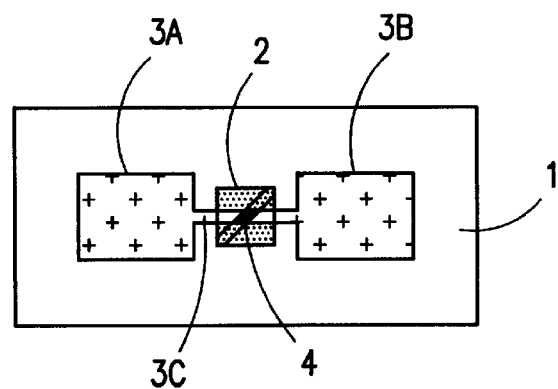
FIG. 3(e) is a schematic plan view in the final step for producing the embodiment of an oxide superconductor Josephson junction element according to the present invention.

As shown in FIGS. 3(d) and 3(e), a line pattern 3C having a width of 2 μm and a length of 30 μm is formed such that it crosses the needle-like, a-axis (or b-axis) oriented portion. Electrode pads 3A and 3B for outputting are then formed.

Figure 4:
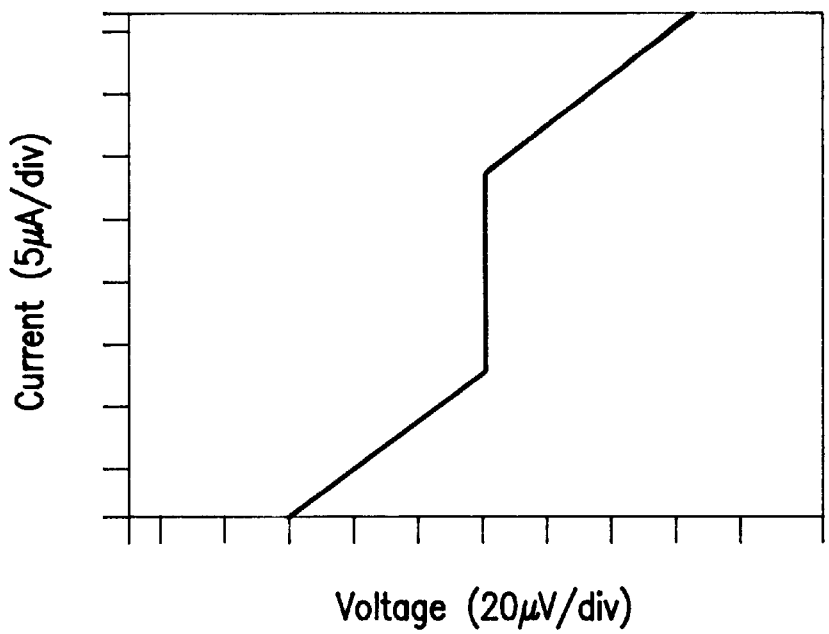
FIG. 4 shows electrical current voltage characteristics of the embodiment of an oxide superconductor Josephson junction element according to the present invention.

FIG. 4 shows electrical current voltage characteristics of the thus prepared embodiment 1 of an oxide superconductor Josephson junction element. The measurement was carried out by the conventional four terminal method. The measurement was performed at a temperature of 4.2 K while applying an outside magnetic field of about 3 Gausses (G) in a direction normal to the plane in which the current flows in the element. In view of the fact that weak link-type characteristics are observed, it is understood that a Josephson junction is formed.

Figure 5:
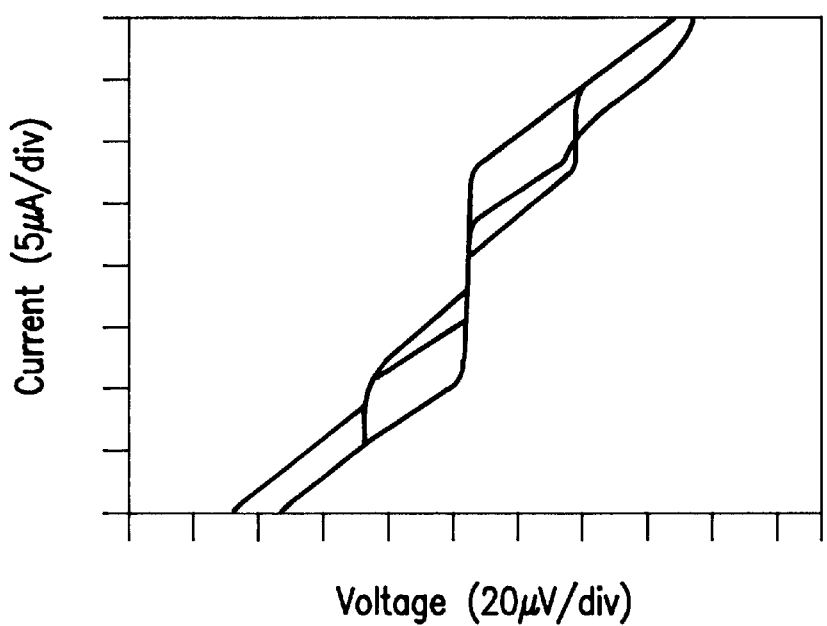
FIG. 5 shows electrical current voltage characteristics of the embodiment of an oxide superconductor Josephson junction element according to the present invention in the case where it is irradiated with a microwave.
Figure 6:
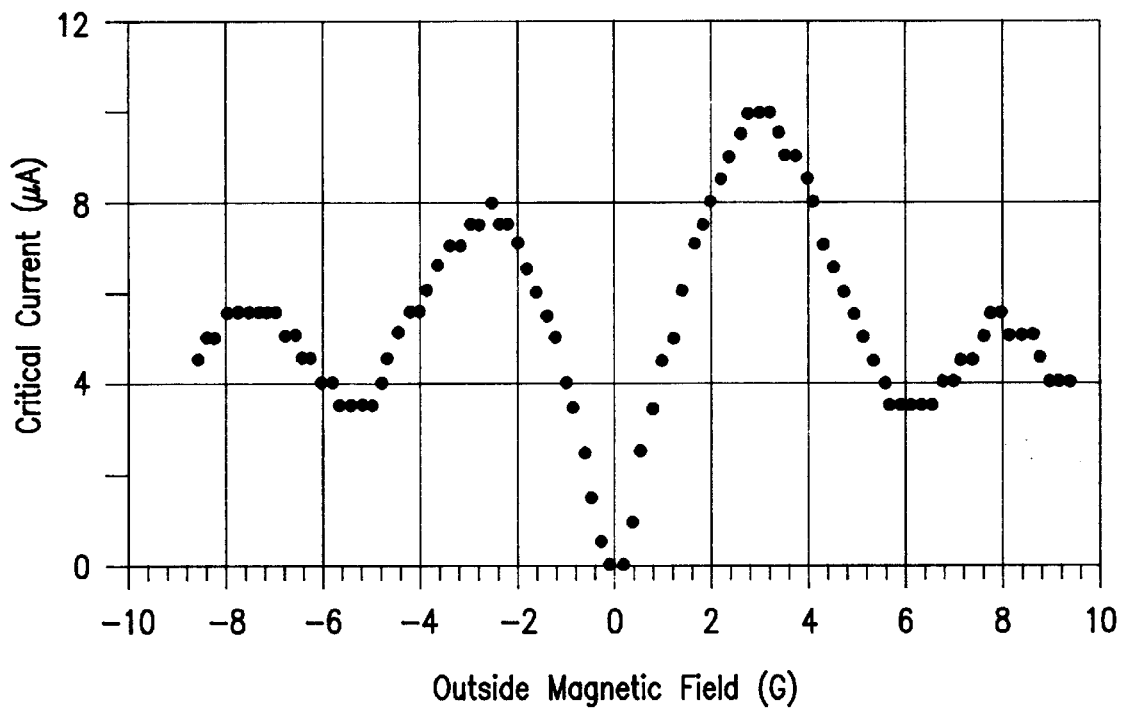
FIG. 6 is an illustration showing magnetic field dependency of the critical current (Ic) of the embodiment of an oxide superconductor Josephson junction element according to the present invention.

When the element was irradiated with a microwave, current step (Shapiro step) characteristics were observed at a voltage corresponding to the frequency of the microwave (FIG. 5). This also indicates that a Josephson junction is formed.

When similar measurement was carried out without applying the outside magnetic field, no superconducting current was observed. When the critical current (Ic) was measured while varying the intensity of the outside magnetic filed, such a specific magnetic field dependence pattern that Ic=0 when the magnetic field is 0 and Ic is maximum when the magnetic field is about ±3G. Such a magnetic field dependence is attributed to the fact that the characteristics of the $NdBa_2Cu_3O_{7-x}$ superconductor as a d-wave superconductor are macroscopically seen because the (110) plane and (001) plane of $NdBa_2Cu_3O_{7-x}$ form the junction.

The phenomenon in the present invention that the a-axis oriented crystal grains are formed only in the focused ion beam-irradiated region 2 is considered to be caused as follows.

Figure 7:
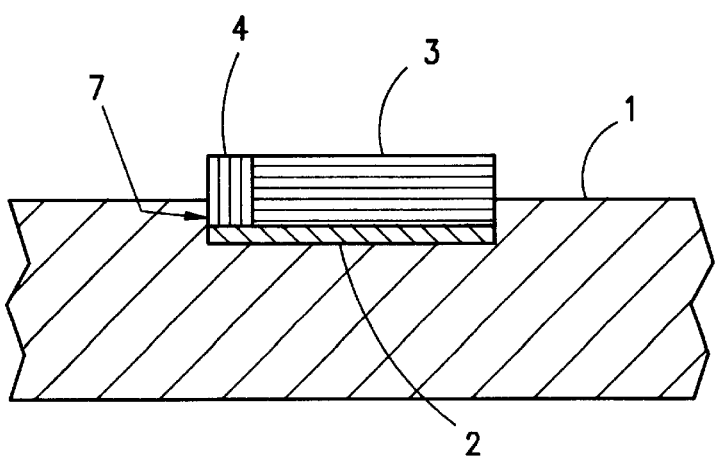
FIG. 7 is an illustration explanatory of the phenomenon of the formation of a-axis oriented crystal grains at only the region which is irradiated with a focused ion beam according to the present invention.

As shown in FIG. 7, the region 2 irradiated with the ion beam is engraved to form a step 7 lower by an order of 10 nm to 100 nm than the other region. This step 7 serves as an occasion for the growth of a-axis crystal grains.

Figure 8:
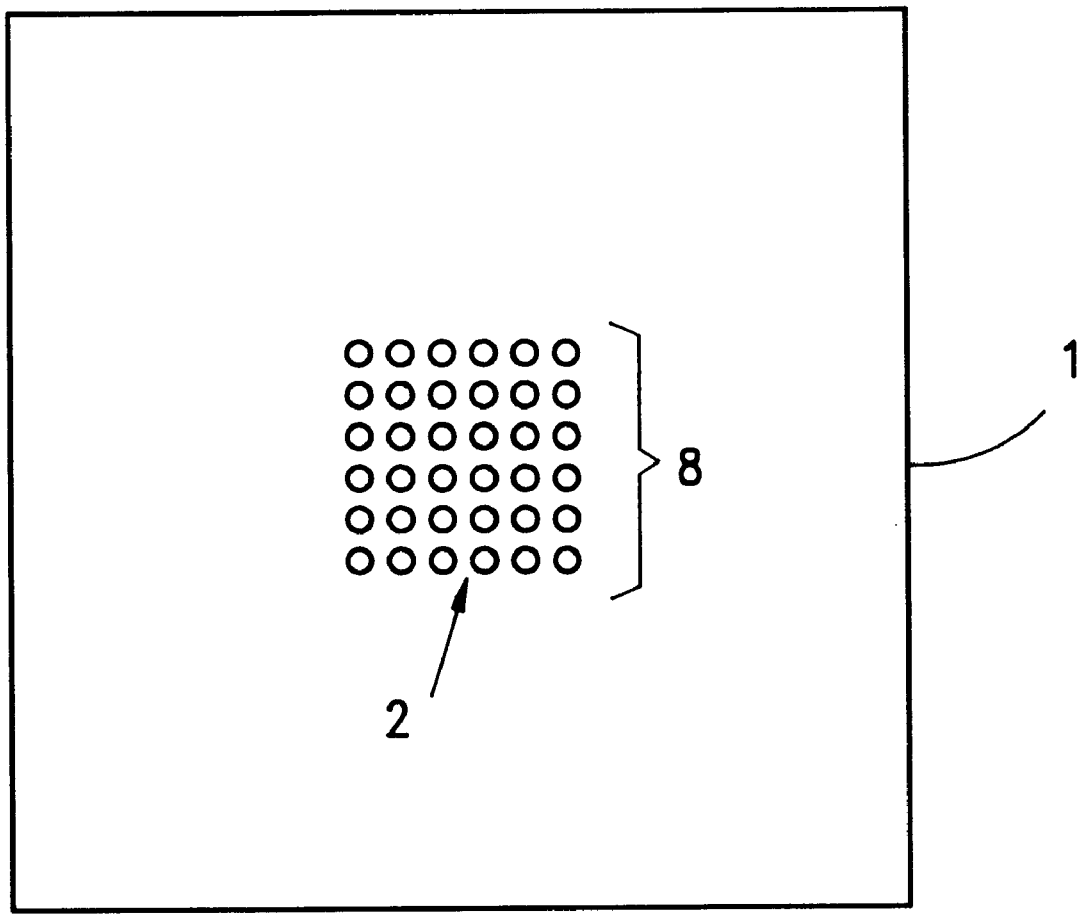
FIG. 8 is an illustration for explaining that the c-axis direction of the needle-like, a-axis or b-axis oriented oxide superconductor film region is oriented in the (110) direction which is inclined at an angle of 45 degrees with respect to the (100) direction or (010) direction of the substrate or the c-axis oriented oxide superconductor film.

The c-axis direction of the region of the needle-like, a-axis (or b-axis) oriented film is oriented in the (110) direction in which the crystal grains are grown at an inclination angle of 45 degrees with respect to the (100) direction or (010) direction of the substrate and the c-axis oriented oxide superconductor film. When microscopically seen, the focused ion beam irradiation method is regarded as being repetition of irradiation at a focused spot for a certain period of time throughout the whole irradiating region. Thus, the region 2 irradiated with the focused ion beam is composed of a matrix of orderly arranged spots engraved by the focused ion beam (FIG. 8). This arrangement is considered to be related to the "crystal grains are grown at an inclination angle of 45 degrees".

Thus, in accordance with the above embodiment of a process for producing an oxide superconductor Josephson junction according to the present invention, since the a-axis or b-axis oriented crystal grains are formed only on the focused ion beam-irradiated region 5, it is possible to produce the a-axis or b-axis oriented oxide superconductor film region with good reproducibility. As a consequence, there is obtained a new oxide superconductor Josephson junction element capable of being applied to practical circuits and composed of a needle-like, a-axis (or a b-axis) oriented oxide superconductor provided at a predetermined position of a substrate and c-axis oriented oxide superconductors.

In the above embodiment, c-axis oriented $LnBa_2Cu_3O_{7-x}$ ($0 \leq x \leq 0.5$) deposited by a RF sputtering method or a pulse laser method is used as an oxide superconductor. However, it will easily be inferred that $LnBa_2Cu_3O_{7-x}$ (Ln: a rare earth element including Y, $0 \leq x \leq 0.5$) deposited by a method selected from a sputtering method, a pulse laser method, a chemical vapor phase deposition (CVD) method and concurrent vapor deposition method may be used as the oxide superconductor. For example, the similar result was obtained when c-axis oriented $YBa_2Cu_3O_{7-x}$ ($0 \leq x \leq 0.5$) deposited by a pulse laser method was used as the oxide superconductor.

The invention made by the present inventors has been particularly described on the basis of the above embodiment. It is without saying that the present invention is not limited only to the above embodiment and that various changes are able to be made without departing from the gist thereof.

The effects attained by the present invention will be briefly summarized below.

(1) There is obtained a new oxide superconductor Josephson junction element capable of being applied to practical circuits and composed of a needle-like, a-axis (or a b-axis) oriented oxide superconductor provided at a predetermined position of a substrate and c-axis oriented oxide superconductors.

(2) Since the Josephson junction characteristics of the oxide superconductor Josephson junction element are such that the critical current (Ic) is 0 when the external magnetic field is 0 and has a finite critical current value of not zero when an infinite external magnetic field exists, it is possible to easily apply the device to practical circuits; an electric device including, for example, NOT circuit can be easily realized.

(3) An oxide superconductor Josephson junction element composed of a-axis (or a b-axis) oriented oxide superconductor provided at a predetermined position of a substrate and c-axis oriented oxide superconductors can be prepared with good reproducibility.

(4) By using a focused ion beam device, a superconducting element having new functions can be formed at a predetermined position of a substrate.

What is claimed is:

1. An oxide superconductor Josephson junction element comprising a substrate and, on said substrate, oxide superconductors oriented in the c-axis direction with respect to said substrate, and an a-axis or b-axis oriented oxide superconductor, sandwiched between said c-axis oriented superconductors, said a-axis or b-axis oriented oxide superconductor having opposing sides contacting said c-axis oriented superconductors along crystal boundaries defining a junction plane extending across said c-axis oriented superconductors in a direction perpendicular to the a-axis of the a-axis oriented superconductor or to the b-axis of the b-axis oriented superconductor, the crystal boundaries between said a-axis or b-axis oriented oxide superconductor and each of said c-axis oriented superconductors forming a weak link of the Josephson junction, and said a-axis or b-axis oriented oxide superconductor having a c-axis perpendicular to said junction plane, parallel to the (110) plane of said c-axis oriented superconductors and inclined at an angle of 45 degrees with respect to the (100) plane or (010) plane of said c-axis oriented superconductors.

2. An oxide superconductor Josephson junction element as recited in claim 1, wherein said a-axis or b-axis oriented oxide superconductor is provided only on a focused ion-beam irradiated region at a predetermined position on a surface of said substrate.

3. An oxide superconductor Josephson junction element as recited in claim 1 wherein the critical current (Jc) thereof is zero when an external magnetic field is zero and is a finite critical current value when in a finite external magnetic field.

4. An oxide superconductor Josephson junction element as recited in claim 1, wherein said oxide superconductors are $LnBa_2Cu_3O_{7-x}$, wherein Ln is a rare earth element including Y, and x is within a range defined as $0 \leq x \leq 0.5$.

5. An oxide superconductor Josephson junction element as recited in claim 1, wherein said oxide superconductors are $NdBa_2Cu_3O_{7-x}$, and wherein $0 \leq x \leq 0.5$.

6. An oxide superconductor Josephson junction element as recited in claim 1, wherein said oxide superconductors are $YBa_2Cu_3O_{7-x}$, and wherein $0 \leq x \leq 0.5$.

7. A process for producing an oxide superconductor, characterized in that a surface flatness deteriorated region or a composition deteriorated region is previously formed on a predetermined position of a substrate and in that an oxide superconductor is then grown to form an a-axis (or b-axis) oriented oxide superconductor region only on said surface flatness deteriorated region or composition deteriorated region with said other region being provided with a c-axis oriented oxide superconductor.

8. A process as recited in claim 7, characterized in that said surface flatness deteriorated region or composition deteriorated region is formed by irradiating said substrate with a focused $Ga_+$ ion beam from above.

* * * * *